(12) United States Patent
Stautner et al.

(10) Patent No.: US 10,184,711 B2
(45) Date of Patent: Jan. 22, 2019

(54) CRYOGENIC COOLING SYSTEM

(71) Applicant: GENERAL ELECTRIC COMPANY, Schenectady, NY (US)

(72) Inventors: Ernst Wolfgang Stautner, Niskayuna, NY (US); Andrew Michael Leach, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 704 days.

(21) Appl. No.: 14/281,105

(22) Filed: May 19, 2014

(65) Prior Publication Data
US 2015/0332829 A1   Nov. 19, 2015

(51) Int. Cl.
*H01F 6/04* (2006.01)
*F25D 3/10* (2006.01)
(Continued)

(52) U.S. Cl.
CPC ............... *F25D 3/10* (2013.01); *F25B 9/10* (2013.01); *F25B 25/005* (2013.01); *F25D 19/00* (2013.01);
(Continued)

(58) Field of Classification Search
CPC .... H01F 6/04; F17C 3/085; F17C 2203/0687; G01R 33/3804
(Continued)

(56) References Cited

U.S. PATENT DOCUMENTS 5,220,800 A   6/1993   Muller et al.
5,594,342 A   1/1997   Brey et al.
(Continued)

FOREIGN PATENT DOCUMENTS

EP   0903588 A1   3/1999
EP   2348267 A2   7/2011
(Continued)

OTHER PUBLICATIONS

Rieger, Siemens Activities in Superconductivity, 2004.*
(Continued)

*Primary Examiner* — Eric Ruppert
(74) *Attorney, Agent, or Firm* — GE Global Patent Operation; Pabitra Chakrabarti (57) ABSTRACT

A cryogen cooling system to cool a superconducting magnet is disclosed herein utilizing embedded vertical tubing with a large heat exchanging surface area. The tubing encompasses the magnet which is further surrounded by a 4 Kelvin thermal shield for extended ride-through. In one embodiment, the system is a hyperpolarizer having an internal high-pressure gas storage for quench gas and to initiate cool-down. Aspects of the invention utilize a minimal volume of pressurized gas, for example, four (4) liters of pressurized gaseous helium in a 150 mL liquid helium system. As such, the prior vent stack has been removed, along with the helium vessel and quench paths/ducts. The method of using the system is further simplified during ramping while the cool-down process utilizing liquids supplied from external dewars has been eliminated. Significant advantages include reducing the helium volume (and cost associated therewith) and allowing for a hermetically sealed vacuum system that is leak-proof.

8 Claims, 4 Drawing Sheets

(51) Int. Cl.
  *F25B 9/10* (2006.01)
  *F25B 25/00* (2006.01)
  *F25D 19/00* (2006.01)
  *G01R 33/3815* (2006.01)
  *F17C 3/08* (2006.01)

(52) U.S. Cl.
  CPC .............. *H01F 6/04* (2013.01); *F17C 3/085* (2013.01); *F17C 2203/0687* (2013.01); *F25B 2400/17* (2013.01); *G01R 33/3815* (2013.01)

(58) Field of Classification Search
  USPC .............................. 62/6, 51.1; 505/163, 892
  See application file for complete search history.

(56) References Cited

U.S. PATENT DOCUMENTS

| | | |
|---|---|---|
| 8,008,914 B2 | 8/2011 | Penanen et al. |
| 8,319,588 B2 | 11/2012 | Calvert |
| 8,374,663 B2 | 2/2013 | Laskaris et al. |
| 8,643,367 B2 | 2/2014 | Huang et al. |
| 2013/0109574 A1 | 5/2013 | Stautner |
| 2013/0160975 A1 | 6/2013 | Stautner |

FOREIGN PATENT DOCUMENTS

| | | | |
|---|---|---|---|
| GB | 2490189 A | | 10/2012 |
| JP | 02060455 | * | 2/1990 |
| WO | 2005114244 A1 | | 12/2005 |
| WO | 2005116516 A1 | | 12/2005 |
| WO | 2006051251 A1 | | 5/2006 |
| WO | 2012143172 A1 | | 10/2012 |

OTHER PUBLICATIONS

Bredy, Experimental and Theoretical Study of a Two Phase Helium High Circulation Loop, 2006.*
Stautner, A New Cooling Technology for the Cooling of HTS Magnets, 2007.*
Yamamoto, JP02060455TRANS (English Translation), Feb. 1990.*
Stautner et al., "A New Cooling Technology for the Cooling of HTS Magnets", Applied Superconductivity, IEEE Transactions, vol. 17, Issue 2, pp. 2200-2203, Jun. 2007.
Stautner et al., "System and Method for Transferring Heat Between Two Units", U.S. Appl. No. 14/108,387, filed Dec. 17, 2013, pending, pp. 1-21.
Ardenkjaer-Larsen et al., "Dynamic Nuclear Polarization Polarizer for Sterile Use Intent", NMR Biomedicine, Wiley Online Library, Jan. 10, 2011, pp. 1-6.

* cited by examiner

CRYOGENIC COOLING SYSTEM

FIELD

The subject matter disclosed herein relates to a cryogenic system, particularly as it relates to a cryogenic cooling system for superconducting magnets.

BACKGROUND

Superconducting magnets conduct electricity without resistance as long as magnets are maintained at a suitably low temperature, which is referred to as "superconducting temperature" herein after. Accordingly, cryogenic systems are used to ensure that the superconducting magnets work below the critical ["transition"] temperature of the superconductor.

One conventional cryogenic system uses a cooling coldhead/cryocooler which is mounted to the superconducting magnet. Such mounting of the cooling coldhead to the superconducting magnet has several disadvantages including the detrimental effects of stray magnetic fields on the coldhead motor, vibration transmission from the coldhead to the superconducting magnet, and temperature gradients along the thermal connections between the coldhead and the superconducting magnet. An example of this system would be a "conduction-cooled" system.

Another conventional cryogenic system uses a large volume of liquid cryogen in a cryogen bath to maintain the operating temperature of the superconducting magnet. This cryogen bath (helium can) is exposed to heat loads, such as thermal radiation and conduction from room temperature to the temperature of the cryogen. The liquid helium bath therefore boils off liquid. In some cryogenic systems housing a magnet, the boil off cryogen gas vents to the atmosphere and periodic cryogenic service to refill the cryogen is required. Other cryogenic systems use a refrigerator or a cryocooler to re-condense the boil-off cryogen gas back to liquid. When the refrigeration is turned off, however, by loss of electric power or during periodic system maintenance, or when the magnet quenches and the stored energy of the magnet is dumped into the liquid helium bath, a large amount of boil-off cryogen gas vents to the atmosphere and is lost. Cryogenic service and cryogen refilling are also needed once the refrigeration is turned back on.

One such cryogenic system is routinely used in high resolution NMR spectroscopy to determine molecular structure. For instance, dynamic nuclear polarization is used to enhance nuclear polarization of samples for use in applications such as nuclear magnetic resonance (NMR) analysis including nuclear magnetic resonance imaging (MRI) and analytical high resolution NMR spectroscopy (HRS). MRI has become a particularly attractive diagnostic tool as it is non-invasive and does not involve exposing the patient under the study to potentially harmful radiation such as X-rays.

MRI and NMR spectroscopy, however, lack sensitivity due to the normally very low polarization of the nuclear spins of the materials used. Thus, the dynamic nuclear polarization technique has been developed to improve the polarization of nuclear spins. During the process, a liquid sample is mixed with a polarizing agent and placed in a sample cup which is mounted to a sample holding tube. The sample holding tube is then inserted into the bore of a superconducting magnet located in a cryostat so as to bring the sample to a working volume within the bore, the working volume being located in a microwave cavity defined by a polarization insert. The superconducting magnet generates a magnetic field of suitable strength and homogeneity in the working volume. The sample is cooled and solidified by exposing it to liquid helium (He) in the bore and then irradiated with microwaves while it is exposed to the magnetic field and in its frozen state. The sample is then lifted out of the liquid helium to a position in which it is still subject to the magnetic field, but less homogeneous. Hot solvent is then supplied into the sample holding tube, typically through a dissolution tube/stick or other solvent conveying system, to the working volume so as to dissolve the polarized sample. Thawing in about 10 seconds or less can retain about 50% hyperpolarization in the liquid state. Alternatively, the sample may be melted. The solution or melt is then rapidly extracted and transferred for subsequent use either for analysis in an NMR system or, in the case of in vivo applications, injection into a patient.

One of the drawbacks of the system is the need to move the sample out of the working volume in order to remove it from the influence of the liquid helium prior to supplying hot solvent. This is mechanically complex and costly. Further, problems arise when the helium level in the variable temperature insert (VTI) falls significantly when a sample is loaded and when the dissolution takes place due to the heat dumped into the VTI (causing high He consumption and slow recovery of He level). In addition, the sample holder and dissolution stick are moving parts, expensive to automate. Attempts to solve this problem have utilized a waveguide without contact to liquid He, the waveguide thermally anchored to the thermal shield bore. While the walls are at the temperature of the thermal shield and the base at liquid helium temperature, the sides and base of the microwave cavity are not galvanically or thermally connected and rather electrically connected by capacitive coupling to attempt to act as a non-resonant cavity to localize and concentrate the microwave power density around the sample. Net loss of liquid He, however, is unavoidable.

A hyperpolarizer, like other NMR or MRI magnets utilizes a bath of liquid helium, typically a container for the cryogen. The container and the corresponding tubes for filling the helium container, including the neck tubing connecting the helium vessel to the vacuum vessel, are designed according to the pressure vessel directives. Such directives include the design of safety features that allow safe operation of the hyperpolarizer in operating modes.

In addition, the current status of the hyperpolarizer is complicated. The hyperpolarizer operates at sub-atmospheric conditions which utilize an external buffer volume fed from a helium gas bottle to protect the magnet from air ingress through any feed-throughs or safety features. This is to ensure that leaking safety features, such as burst disks, safety valves, and feed-throughs in the vent stack consume gaseous helium only and consequently protect the magnet from air ingress. Additional operating modes (e.g. at cooldown and magnet ramp (energizing)) necessitate the support of a cryogenic technician. This is especially inconvenient at the customer site, e.g. an MRI suite, particularly as the technician waits for cryogens to be delivered. Further burden is delay as sometimes the delivery schedule changes due to the unavailability of helium.

In the event of the magnet losing its superconducting state and the stored energy dumped into the helium bath, the volume of gas created from about 40 liters of liquid He, for example, is as great as 28,000 L of gaseous He, a volume that is vented off to reduce pressure from the helium vessel during quench. Various components, including the vent stack to remove pressure from the substantial volume of gas during this event, are based on the liquid inventory of about 40 liters He. As used in the system, the He needs to be safely transferred through the dedicated vent stack and released to atmosphere. Valve chattering during this gas release at temperatures at or around about 10 K can also contribute to greater valve leaks upon closure of the valve. When returning to normal operating conditions, the gas flow from the gas bottle to the vent stack increases. This, in turn, requires monitoring of the gas flow. The valve may also need replacement. In this case, further system downtime is to be expected and maintenance and service cost of the vent stack increases.

It is therefore desirable to have a cryogenic system that comprises a very small volume of cryogen in a hermetically closed system so that no cryogen diffuses in or out of the system and venting to atmosphere is eliminated. Thus, a need exists for a component with high-efficiency heat transfer to the magnet to allow the magnet to maintain its supercounducting state and also facilitates quick cool-down or re-cooling of components in a hyperpolarizer system, thereby reducing system cost and allowing the overall system to operate with higher efficiency.

The new hyperpolarizer design will eliminate the need for large quantities of liquid helium, by far less than the current 40 liters of liquid helium, so as to eliminate release of 700 times that volume in gaseous form. The cooling of the magnet will desirably be further simplified to permit efficient operation by a push-button approach without interference or user/operator error.

SUMMARY

The above and other drawbacks or deficiencies may be overcome or alleviated by development of a system for cryogenic cooling in a hyperpolarizer system that introduces modified low cryogen magnet type design aspects.

Embodiments of a cryogen cooling system to cool a superconducting magnet are disclosed herein utilizing embedded vertical tubing with a large heat exchanging surface area. The tubing encompasses the magnet which is further surrounded by a 4 Kelvin thermal shield for extended ride-through. In one embodiment, the system is a hyperpolarizer having internal high-pressure gas storage for quench gas and to initiate cool-down. Aspects of the invention utilize a minimal volume of pressurized gas, for example, about four (4) liters of pressurized gaseous helium in about a 150 mL liquid helium system. As such, the prior vent stack has been removed along with the helium vessel and quench paths and/or ducts. The method of using the system is further simplified during ramping while the cool-down process utilizing liquids has been eliminated. The cryocooler is adapted to operate at temperatures at or below about 4 K for magnets wound of low temperature superconductors. When gaseous helium starts to recondense at the coldhead fins, the heat pipes will be gradually filled with liquid helium. The magnet is then cooled in thermosiphon mode. The internally stored gas supply (e.g. one gallon gas bottle 112) within the cryo-vessel 102, as referred to also as the outer vacuum case (OVC), satisfies operating regimes, including quench. Significant advantages include reducing the helium volume (and cost associated therewith) and allowing for a hermetically sealed vacuum system.

Embodiments of the system include a low volume cryogen cooling system comprising: a cryo-vessel having sidewalls, a top plate, and a bottom plate to form a hermetically sealed vacuum chamber; one or more pressurized gas bottles positioned internal to the cryo-vessel, the gas bottle storing pressurized gaseous cryogen; at least one superconducting magnet capable of generating a magnetic field and operating at temperatures less than 4 Kelvin, wherein the superconducting magnet is suspended in the hermetically sealed vacuum chamber by way of a suspension rod, and further comprising a charging connection; a plurality of cooling tubes arranged vertically around the superconducting magnet, each cooling tube have a top portion interconnected with an uppermost tubular framework and a bottom portion terminating at a lower tubular framework, wherein the top portion and the bottom portion are adjoined by a tube link; a recondenser connected to a second stage of the cryocooler which provides a thermal connection, the recondenser comprising tubing that receives cryogen from the plurality of cooling tubes and directs liquid cryogen to the lower tubular framework by way of gravitational force; a first heat exchanger embedded in the uppermost tubular framework; a thermal shield encompassing the plurality of cooling tubes and in thermal contact with a first stage of a cryocooler, the thermal shield having an inner component and an outer component that connect at a top surface and a bottom surface to enclose the plurality of cooling tubes and form a vacuum space centralized at a core of the cryo-vessel; and a pathway accessing the core; wherein the plurality of cooling tubes are filled with liquid cryogen to form a thermosiphon system adapted to cool the superconducting magnet to temperatures at or below about 4 Kelvin.

Embodiments of the invention also encompass the method of utilizing the system to cool a superconducting magnet, the steps comprising: filling the plurality of cooling tubes by way of a control valve with gaseous helium from an external helium filling station; operating a cryocooler in a range from about 2.5 K to about 4.2 K for low temperature superconducting magnet coils, liquefying the gaseous helium by liquefaction fins associated with the plurality of cooling pipes; filling and storing liquefied helium in the plurality of cooling tubes to form a thermosiphon system; and cooling at least one superconducting magnet to operate in the temperature range of about 2.5 to about 4.2 Kelvin. Various uses of the system may be implemented with hyperpolarizers, NMR, EPR, MR, Raman spectroscopy, among others.

Furthermore, the system as implemented in applications of the hyperpolarizer technology may be utilized in metabolic research, including understanding of cellular metabolic activity. The high-throughput, fully-automated hyperpolarizer utilizes minimum helium while implementing an integrated fluid path, quality control system, and simultaneously hyperpolarizes multiple samples [of pyruvate] or other compounds to produce imaging agents.

In embodiments of the system of the invention, quench gas is captured within the cryo-vessel. The magnet runs at sub-atmospheric pressure and no maintenance is required. No icing is possible since the system is hermetically closed to atmosphere without the need for valves. Ramping the magnet is possible using retractable, built-in leads that therefore do not add a permanent heat load to the magnet. In addition, the customer does not need to supply any helium to the system for cooling the current leads. The system design is simplified, more compact and reliable than known systems to date.

DETAILED DESCRIPTION

Various embodiments will be described more fully hereinafter with reference to the accompanying drawings. Such embodiments should not be construed as limiting. For example, one or more aspects can be utilized in other embodiments and even other types of devices. Referring to the drawings in general, it will be understood that the illustrations are for the purpose of describing particular embodiments and are not intended to be limiting.

Figure 1:
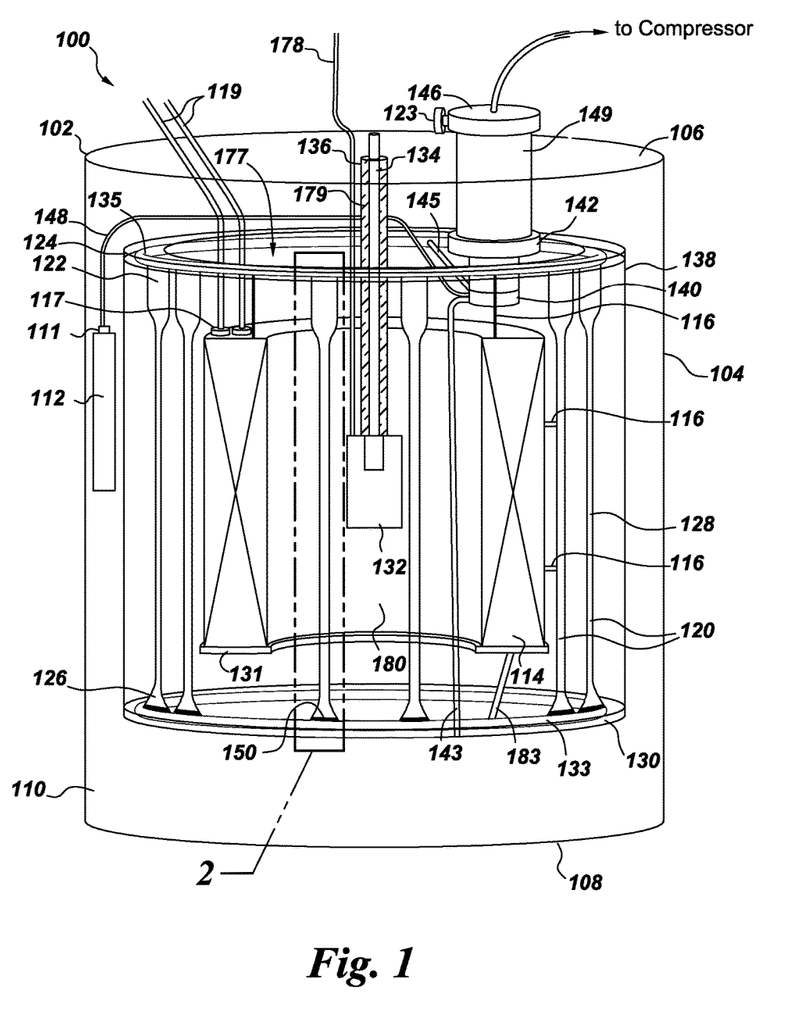
FIG. 1 depicts a perspective view of an embodiment of the present invention.

In an embodiment of the invention, a low volume cryogen cooling system 100 is described, as shown in FIG. 1. The system comprises a cryo-vessel 102 that is an outer vacuum case (OVC) comprising sidewalls 104, a top plate 106, and a bottom plate 108 to form a hermetically sealed vacuum chamber 110. One or more high-pressure gas bottles, or containers 112, are positioned internally within the cryo-vessel 102 such that the gas bottles store pressurized gaseous cryogen between about 20 bar to about 40 bar, or higher. In one aspect, the cryogen is helium. In another aspect, any number of cryogens may be utilized, including but not limited to nitrogen, hydrogen, neon or other refrigerants and/or gas mixtures and combinations thereof depending on the type of superconductor used and the superconducting transition temperature used for a magnet 114. As shown in the embodiment depicted in FIGS. 1 and 3A, the pressurized gas containers 112 are positioned external to the outer thermal shield 138. The containers 112, however, can be situated within the inner diameter of the inner thermal shield 189, or between the other thermal shield 138 and the inner 4K thermal shield 189 for greater cooling efficiency.

In one aspect, the inner thermal shield 189 and the outer thermal shield 138 connect at a top surface 177 and a bottom surface to enclose a plurality of cooling tubes 120 and form a vacuum space centralized at a core 180 of the cryo-vessel; and a pathway 134 accesses the core.

Figure 3A:
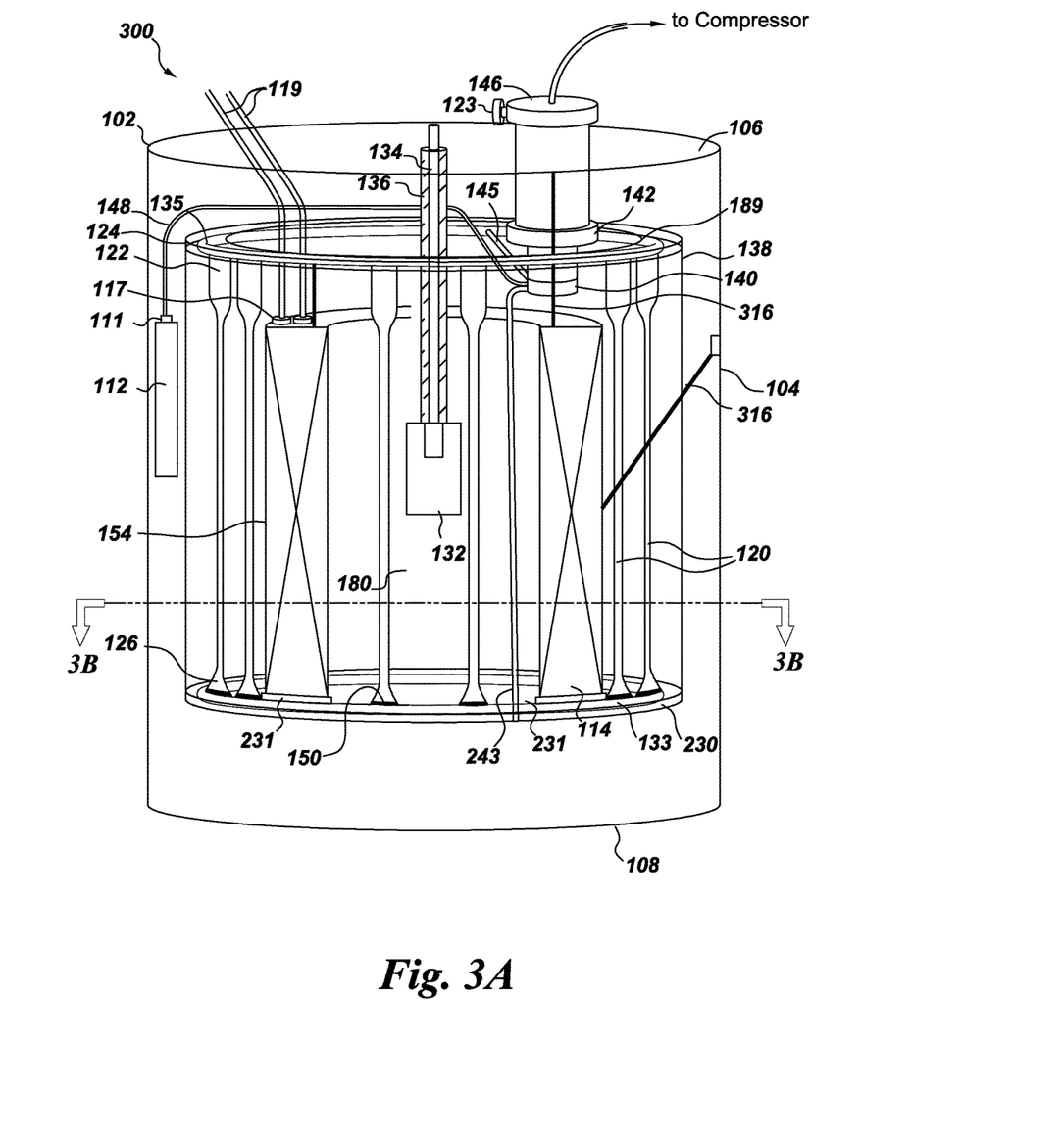
FIG. 3A is another embodiment of the system of the invention.

The superconducting magnet 114 (e.g. a solenoid), having the overall typical dimensions of about 0.5 m in diameter, about 1 m in height, and a bore size of about 50 to about 150 mm at room temperature, is capable of generating a magnetic field in the range of about 3 to about 10 Tesla operating at temperatures less than about 4 Kelvin (4 K), typically in the range of about 2.5 K to about 4.2 K. In one aspect, high temperature superconductors may be utilized in which the temperature range can be extended to temperatures up to about 77 K. The superconducting magnet is suspended in the hermetically sealed vacuum chamber by way of one or more suspension rods 116/316, respectively in FIGS. 1 and 3A, and also comprises a retractable charging connection 117. In one aspect, as shown in FIG. 1, the suspension rods are attached to the thermosiphon network where the plurality of cooling tubes and tubular framework have the strength to support the magnet. In another aspect, as shown in FIG. 3A, the magnet is suspended from an internal wall of the cryo-vessel, or an attachment to the wall for additional support. Further aspects include charging rods 119 that are retractable leads 119 removably placed to charge the magnet at the charging connection, and then retracted.

Further, the plurality of cooling tubes 120, also referred to as heat pipes or thermosiphons 120, are arranged vertically around (e.g. encompassing tightly) the superconducting magnet 114, each cooling tube have a top portion 122 interconnected with an uppermost tubular framework 124 and a bottom portion 126 terminating at a lower tubular framework 130 such that the top portion 122 and the bottom portion 126 are adjoined by a tube link 128. A first heat exchanger 135 is embedded in the uppermost tubular framework 124. In one aspect, the heat exchanger 135 extends from the top portion of the uppermost tubular framework (e.g. coil) allowing the top portion to thermally contract. A second heat exchanger 133 is embedded in the lower tubular framework 130 to allow for additional heat transfer and cooling. In one aspect the lower tubular framework 130 may act as a cold plate where the superconducting magnet rests (as shown in FIG. 3A). As illustrated in FIG. 1, thermal straps 183 connect cold plate 131 to the lower tubular framework 130, the thermal straps comprising copper braids or a flexible copper link. Thermal straps allow maintenance of the temperature of the coldplate with the lower tubular framework 130 since the coldplate is not assembled close to the tubular framework 130. As illustrated, drain tube 143 vertically connects to the lower tubular framework 130.

In another embodiment of the invention, the plurality of cooling tubes is embedded in the coil magnet 114 and with the tubular frameworks 124, 130. For example, and not limitation, the radially wound magnet 114 embeds multiple axial thermosiphons 120 (i.e. cooling tubes) coated with polytetrafluoroethylene (PTFE), also known by the trade name of Teflon. In this aspect, multiple magnet layers are interspersed with PTFE coated thermosiphons.

A sample holder 132 is centralized near the superconducting magnet with a sample pathway 134 leading to the sample holder, the sample pathway surrounded by an insulator 136. In one embodiment, the insulator is a vacuum chamber longitudinally encompassing the sample pathway. As such, the vacuum chamber may pull a vacuum on the sample holder 132; in another aspect, the vacuum is pulled on the sample holder via the sample pathway. In addition, the sample holder 132 is interconnected with a cryocooler 144 by way of thermal pathway links 179. As depicted, the thermal pathway links are incorporated with the insulator. Also illustrated in FIG. 1 is the flange 146 of cryocooler 144. A connection 123 to the cryocooler is a valve that is an access point to the cryocooler from an external point. Greater description of the cryocooler and its components are shown in a magnified perspective view of FIG. 2 (not drawn to scale and proportions may vary). A pump pulls a vacuum on the sample holder by way of the sample pathway or another path such that pressure is reduced within the sample holder. A microwave guide tube 178 interconnected with the sample holder connects to a microwave source external to the cryo-vessel. Further, a compressor interconnects with the cryocooler on an upper side (as designated in FIGS. 1 and 3A). The system, as described is hermetically sealed from the external environment once assembled. This provides limited access to the internal components while permitting efficient operation by a push-button approach without interference or user/operator error.

Typically, the sample pathway that forms part of the cryo-vessel via the cryo-vessel top plate is made of stainless steel, but may comprise materials as desired with the selected cryogen compatibility. In one aspect, thermal pathway links (e.g. copper braid) 179 are fitted to the sample pathway and connect to a thermal shield 138 within the cryo-vessel 102 and to the second stage of the cryocooler to achieve the desired temperature of less than about 35 K and about 4 K, respectively. The thermal shield 138 typically comprises aluminum or copper and encompasses the plurality of cooling tubes. Thermal connection 142 of the cryocooler 144 connects to a top plate 177 of thermal shield 138. A recondenser 140 is thermally linked to cold plate 131 via the drain line 143 and feeds liquid helium to the bottom tubular framework/reservoir 130.

Further the pump interconnected with the sample holder has a means to generate a vacuum via an externally positioned vacuum pump or by way of an internally positioned charcoal sorption pump. For exemplary purposes, and not limitation, a heat bus (not depicted) is utilized where a sorption pump is used and connected to the cryocooler. Thus, embodiments of the invention may integrate pumps and components as utilized for applications in spectroscopy such as nuclear magnetic resonance (NMR), paramagnetic NMR, electron paramagnetic resonance (EPR), Raman spectroscopy, among others.

Figure 2:
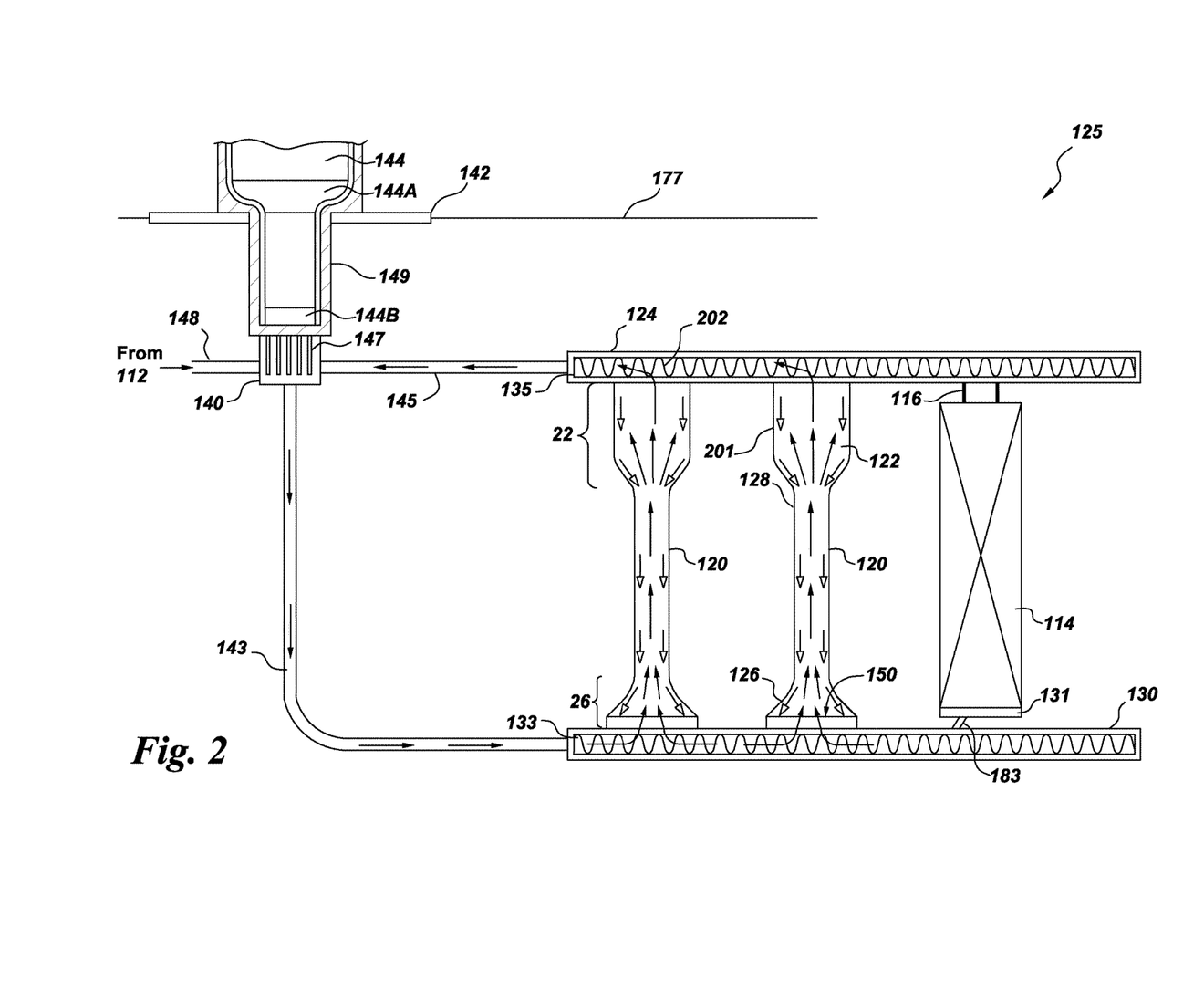
FIG. 2 illustrates a perspective view of a cooling pipe from FIG. 1.

Embodiments of the invention encompass a dual stage cryocooler 144 that provides a cooling surface (illustrated in FIG. 2). FIG. 2 depicts a cryocooler 144 having a first stage 144A and a second stage 144b. The first stage 144A connects to the thermal connection 142 which in in thermal contact with the thermal shield 177. The second stage 144B of the cryocooler narrows to a smaller diameter and fits inside the enclosing sleeve 149. In one aspect, the sleeve 149 mimics the shape of the cryocooler such that no gas leaves the cryocooler and no gas from the outside environment moves into recondenser 140. The second stage 144B is in touch with the copper sleeve 149. As shown in FIG. 2, the recondenser 140 is thermally linked and connected to the second stage of the cryocooler 144B. The second stage of the cryocooler ranges in temperature from about 3 K to about 4 K. A cryogen such as gaseous helium (He) enters the system by way of the pressurized internal container(s) 112 and is directed to the recondenser 140 which comprises liquefaction fins 147. (Note: The recondenser and various components in FIG. 2 are magnified so as to depict such components as liquefaction fins 147, and multiple other components.) The recondenser then directs fluid back to a cold plate 131 (as may be synonymous with the lower tubular framework 130 in an embodiment of the invention in FIG. 3A) by way of gravitational force.

The plurality of cooling tubes fill with liquid once the system is operational so as to form a circulating thermosiphon system adapted to cool and maintain the superconducting magnet to temperatures at or below about 2.5 Kelvin to about 4.2 Kelvin. Note: Gaseous circulation is designated by solid arrowheads in FIG. 2 (as during the cooling phase); the open-headed arrows depict liquid condensing from the upper portion 22 of the cooling tubes.

As illustrated in FIG. 1, the plurality of cooling tubes are arranged cylindrically so as to form a hollow cylinder to house the superconducting magnet. Thus, the cryo-vessel 102 as shown is cylindrical. Any size, shape, and dimension of arrangement of cooling tubes may facilitate operational design of the system and be configured to align with the low volume cryogen use, as desired. In one aspect, the plurality of cooling tubes is comprised of stainless steel, or materials strong enough to support the magnet. The cooling tubes have the capacity to hold a volume of about 300 mL of cryogen such as helium, though any volume may be implemented as desired that can be stored within the gas bottle(s) 112 at various pressures (e.g. between about 20 to 40 bar, higher or lower depending upon user). Here, because of the cost associated with helium and the safety issues involved in the previously used vent stacks, helium reduction is preferred and therefore, the smaller volume that can be utilized the better, so long as the magnet is cooled to the desired operational temperatures and for achieving the user's defined efficiency and temperature stability. For exemplary purposes, and not limitation, the volume of liquid helium utilized is between about 150 mL to about 1000 mL, depending on ramping, or less than about 350 mL in some cases.

FIG. 2 magnifies a portion of a cooling circuit 125 that depicts individual cooling tubes 120 that comprise condensing cups 201 with liquefaction fin 202 of the heat exchanger 135 in the top portion 22 and a porous evaporator surface 150. The bottom surface 150 is integrated with the lower tubular framework which is made of sintered material (e.g. sintered brass or copper). Aspects of the invention may utilize multiple liquefaction fins to permit more rapid heat exchange for quick cool-down. The top portion of the cooling tube connects to the uppermost tubular framework 124 adjacent to the top of the magnet 114; the uppermost tubular framework is also referred to as ring tubing around the top of the magnet. A heat exchanger 135 and liquefaction fin 202, embedded in the uppermost tubular framework 124, facilitate gas flow to the receiving condensing cup 140. In one aspect, during cool-down mode in FIG. 2, gas from the cooling tubes rises and creates a circular convention current around to the recondenser via line 145 and back down through downer/drain line 143 to the lower tubular framework 130. A second heat exchanger 133 embedded in the lower tubular framework 130 provides a heating end of the cooling pipes such that an evaporator surface 150 is positioned within the bottom portion 26 of the cooling tubes. The tube link 128 connects the top and bottom portions in which the diameter is between about 5-8 mm and the length extends from about 20-80 cm or larger, depending on magnet size and magnet field strength requirements. A circulating convection current (as shown by the arrows) inside the tube link and tubular frameworks, from the recondensing surface and down along line/drain tube 143 into lower tubular framework 130, facilitates maintenance of temperatures at or around 4.2 K, or below about 4 K.

Referring back to FIG. 1 and FIG. 2, a drain tube 143 extends from a bottom portion of the recondenser 140 to the cold plate 131 and lower tubular framework 130, respectively. Where the drain tube 243 extends through the cold plate 231 in FIG. 3A, the drain tube feeds into the lower tubular framework 230. Embodiments of the invention utilize a vapor supply line 145 that interconnects with the upper tubular framework 135 as depicted in FIGS. 1, 3A, and in an enlarged view in FIG. 2.

The recondenser 140 sits proximate to the thermosiphons to further eliminate the need for an expensive aluminum heat bus as utilized in prior systems, and thereby have the advantage of cost reduction. In addition, in one embodiment as shown, the recondenser sits in an uppermost portion of the cryo-vessel so that liquid drops or drains by gravitational force into the lower tubular framework 130 (or to the lower cold plate 230 via line or drain tube 243 as shown in FIG. 3). The recondenser, as depicted in FIG. 2, also comprises liquefaction fins 147 to facilitate heat transfer. The multiple cooling pipes with a common evaporator and recondenser arranged in circular ring tubing (e.g. tubular framework) creates a high efficiency convection current (e.g. see solid arrows within the tube link 128) within the closed tubing network of vertical thermosiphons, uppermost and lower tubular frameworks. (NOTE: The solid head arrows in the illustration depict the flow of gaseous cryogen through the downer/drain line 143, and vapor supply line 145 into tubular frameworks 130, 124, respectively. The gas flows upward into the condensation cup 201 and flows down the sides of tube link 128, and thus back into lower tubular framework 130.) The system is interconnected throughout to allow the cryogen to flow, evaporate and condense (i.e. liquid flowing down the inner surfaces of the tube link as shown by open/hollow head arrows), as dependent on the heat exchanging surfaces within the system.

Where the system utilizes helium as the cryogen, the system operates in the range of about 2.5 K to about 4 K, higher or lower depending on coldhead/cryocooler 144 performance and cryo-vessel 102 heat loads to the cryocooler.

The compact system permits warm gas prefill via fill line 148 to pre-pressurized gas bottles 112, which flows to recondenser 140 in the pre-cooling phase. A valve 111 allows an initial charge to the pressurized gas bottle 112 with the desired amount of gas at the specified pressure prior to assembly of the cryo-vessel. In another aspect, a valve that connects the pressurized gas bottle to an external surface of the cryo-vessel allows pressurization after assembly. At the magnet cool-down start, warm helium gas is supplied to recondensing fins 147 in the recondenser 140. Since the helium gas is not being liquefied yet, the cooling tubes 120 operate in heat pipe mode providing an efficient heat exchange for the cool-down of the warm magnet surface. Once all heat from the thermal mass is extracted and helium gas is condensed, the cooling tubes fill with liquid helium; the magnet then achieves its operating temperature and cooling pipes operate in thermosiphon mode.

In one aspect, safety is addressed by removing the previously used vent stack, preventing leaks back into the system and thus preventing the formation of frost or ice. The system is operated at sub-atmospheric pressures and is closed to the environment. This further facilitates user operation by not only creating a space-saving module, but also providing a system that does not require customer support upon installation.

In operation, the plurality of cooling tubes in vertical orientation provides a cool-down heat exchange process. Since the helium is not liquefied during the cool-down process, the heat exchange surface is sufficiently large. When gaseous helium starts to recondense at the condensing cup with decreasing temperatures at cool-down, the cooling tubes gradually fill with liquid helium. The magnet is then cooled in thermosiphon mode with gas bubbles rising with the cooling tubes, eventually drifting to the condensing cups 201, as shown in FIG. 2, and then to the recondenser 140. The internally stored gas supply within the cryostat 112 (e.g. one gallon gas bottle) satisfies a multitude of operating regimes, including quench.

Aspects of the invention integrate vertical tubes that make up the thermosiphon system. The tubes may be any size, dimension and configuration, with embodiments encompassing convection current and flow through the tubes to keep the system cool. The heat exchanging surface in a top ring reservoir or uppermost tubular framework provides an efficient cool-down heat exchange. Further, thermosiphons having a length of about 0.4 to 1 meter work well in vertical orientation, though any length and diameter may be utilized as based on the magnet size and/or desired use of the system. The lower tubular framework 130/230 (FIGS. 1, 3A and 3B, respectively) remains cold, and connects to a cold plate 131 in one embodiment of FIG. 3A, allowing sub-atmospheric operation without showing any ice formation in the former vent stack or other regions in the system. Aspects of the system may include any number of thermosiphons as well. As illustrated in FIG. 1, about a dozen thermosiphons are implemented.

Advantageously, embodiments of the system provide longer ride-through while allowing cryocooler replacement or maintenance. In this aspect, the temperature at the recondenser 140 rises and heat transfers to the magnet 114; the system prevents this by ensuring the wall thickness of the connecting tubing 145 from recondenser 140 to upper tubular 135 is minimized or made of thermally low conducting material. In one embodiment, the magnet is fitted with a 4 K thermal shield 189 on an inner side of the plurality of cooling tubes that allows for a longer coldhead/cryocooler 144 swap time, and thereby allows the thermal shield to act as a thermal battery.

Specifically, FIG. 3A depicts an embodiment of the invention using a system 300 that integrates the cold plate 131 with the lower tubular framework 230 of the thermosiphon network. The drain tube 243 extends from a bottom portion of the recondenser 140 to the cold plate 231 and lower tubular framework 230. The magnet 114 is suspended by suspension rods 316 attached to the cryo-vessel wall. The suspension rods here extend from the top plate 106 of the cryo-vessel and from the sidewalls of the cryo-vessel. In addition, the magnet 114 sits on a cold plate 231 for greater temperature homogeneity and cooling efficiency. The liquid formed by condensing gaseous helium to liquid then drains back via the cold plate 231 to feed into 130.

Figure 3B:
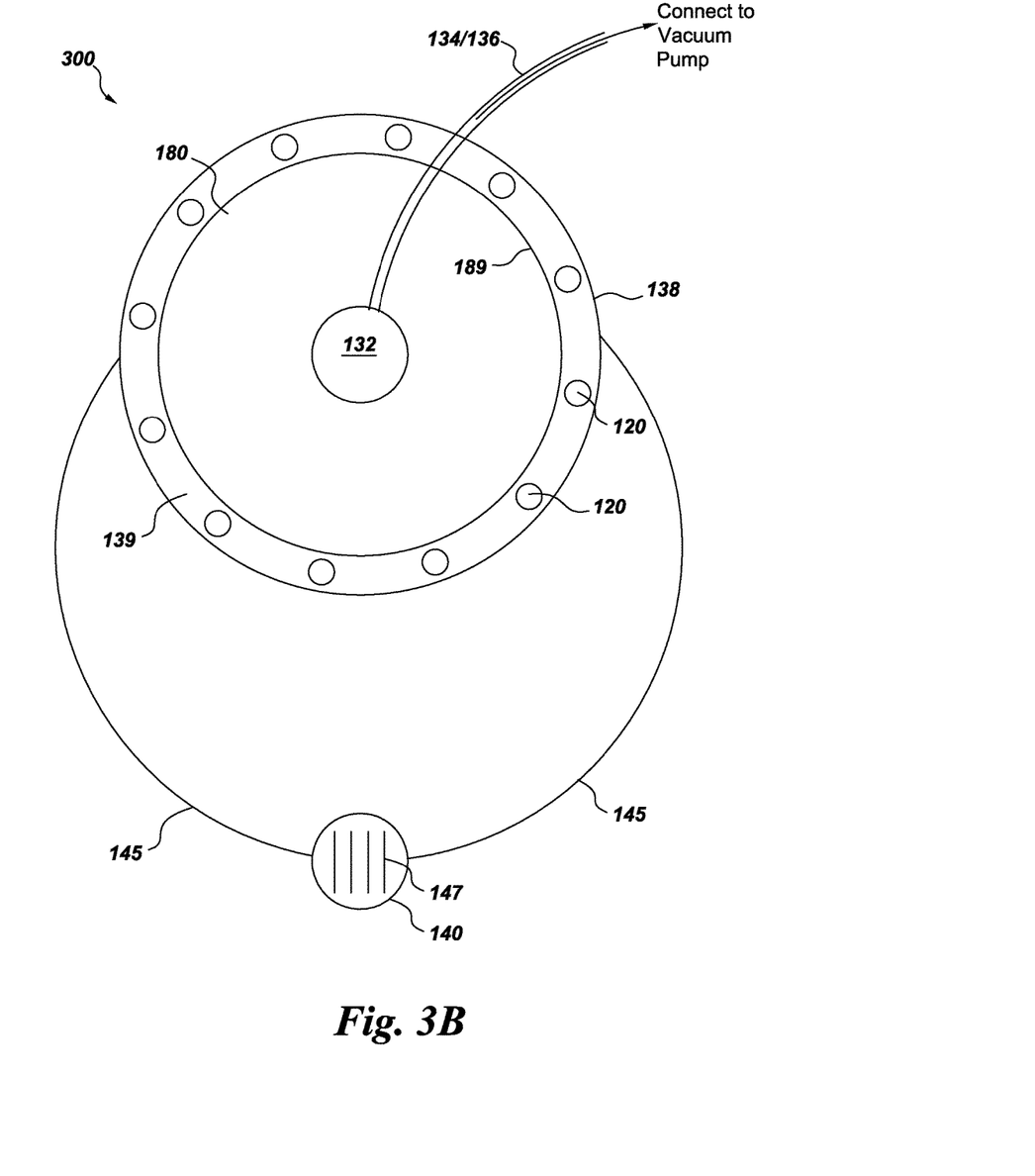
FIG. 3B shows an illustration of a cross-section from FIG. 3A.

In addition, inner thermal shield 189 is disposed on an inner side of the plurality of cooling tubes 120 to create a cylindrical shaped wall, while an outer thermal shield 138 is positioned external to the plurality of cooling tubes, again forming a larger circumferential cylindrical wall surrounding the cooling tubes. In one aspect, the inner thermal shield 189 and outer thermal shield 138 may be interconnected by a top or bottom wall (i.e. see top wall 139 in FIG. 3B) so as to enclose the plurality of cooling tubes. In this embodiment, inner thermal shield 189 and outer thermal shield 138 are thermally linked to the first stage of the cryocooler so that both shields maintain a temperature of about 30 K to about 45 K. The cross-sectional view of FIG. 3A is illustrated in FIG. 3B to illustrate the inner thermal shield 189 and outer thermal shield 138 encasing the plurality of cooling tubes 120.

Installation and Operation

During magnet cool-down, while keeping the magnet cold at operating temperature, a plurality of cooling tubes, thermosiphons, are arranged as shown in FIG. 1 and fitted around the outer magnet surface. For initial cool-down, warm gas is routed to this internal piping via line 148 and into the recondenser 140. The helium gas filled cooling tubes are vertical along the vertical magnet axis and in contact with a bottom cold plate on which the magnet rests. This cold plate connects the cooling tubes to the upper tubular framework. In between the cooling tubes are about two to about six suspension elements, rods 116, more or less, as desired, that are cooled by the cooling tubes and routed half way from the cold plate to the top of the vacuum cryo-vessel top plate. This way the suspension is actively cooled by the cooling tubes. In one embodiment, suspension elements protrude from an upper wall in the cryo-vessel; in another embodiment, suspension elements protrude half way down from the sidewall or the bottom wall of the cryo-vessel. Suspension elements in the embodiments described herein suspend the magnet using the cooling of the thermosiphon structures to reduce overall heat loads and to facilitate more efficient cooling in the overall system.

Cool-down starts as soon as the cryocooler is switched on. The recondenser 140 connected to the cryocooler (coldhead) starts to accept warm gas and cools the warm gas in the ring tubing (tubular framework). As soon as the warm gas is cooled on top it sinks to the bottom (heavier) and gets pushed back when it hits the bottom plate of the magnet. Now, the cooling tubes, as shown in FIGS. 1 and 2, start working by transferring heat from the initially warm magnet surface towards the bottom to the recondenser at the cryocooler.

At one point in time the gas is so cold that it starts to liquefy according to the operational vapor pressure and liquid starts to run down the cooling tubes and starts to fill the cooling tubes. Now the system is cooled down and switched to thermosiphon mode (i.e. filled with liquid to a level of about 90% or more). In this mode, gas bubbles move up along the vertical surface towards the recondenser where they collapse and are liquefied. As demonstrated herein, the cooling tubes, thermosiphons, work most optimally and efficiently in vertical orientation.

Magnet Ramp

For ramping the magnet, the leads that connect to the magnet are retractable. Various options may be utilized. To ramp the magnet (i.e. energize the magnet), approximate 1 liter of liquid He is lost (compared to the 30% of liquid in the previously used 40 liters of He due to heat being generated due to wire resistance and boil off).

Case 1:

Therefore, to install the magnet (ramping it to design field), no liquid reservoir is utilized greater than about 1 L. Thus, where a minimum of 1 L is utilized, about 700 liters of warm gas are initially stored in an internal or external gas bottle 112 (e.g. an internal cryostat), or may be stored as an external cryostat.

Case 1a:

Ramping helium losses are further reduced using retractable leads (e.g. charging rods 119) in combination with embedded high temperature superconductor (HTS) leads, like YBCO (Yttrium-barium-copper-oxide) or similar. In this case, about 150 ml of liquid helium recondenses within liquefaction cup (i.e. recondenser) 140 connected to the second stage 144B of the cryocooler.

Case 2:

The magnet can be ramped with forced flow cooling around the coil using the cooling loop tubes during installation without embedded HTS leads. In this case, only about 150 mL of residing liquid helium are utilized in this system design.

Overall Improvements

Thus, advantages of the system have been realized to remove components for simplification and reconfigure additional materials and attributes to provide a greater efficiency and cooling capacity. In one aspect, the helium reservoir from previous designs has been removed such that the magnet is exposed in a vacuum. In one embodiment, a cold plate at the bottom of a vertical magnet is shaped as circular tubing to provide greater cooling and heat exchange. The plurality of cooling tubes has been optimized for quick cool-down and also work as thermosiphons to keep the magnet cold, the tubes being in close contact with the magnet.

Aspects of the invention integrate ring tubing so that the vertical oriented cooling tubes can receive helium gas. The upper tubular framework, or gas collecting ring, feeds gas to a recondensing chamber for recondensing helium and maintaining a constant liquid level in the thermosiphon tubing. In one embodiment, an array of gas capturing fins within the upper tubular framework (i.e. liquefaction fins noted previously in FIGS. 1 and 2) act as heat exchange surfaces and achieve quick cool-down. The upper tubular framework is in direct contact with the top of a cooling tube at the condensing cup, such that the uppermost heat exchanger 135 is in the upper tubular framework and not the cooling tube itself. This is an improvement with respect to previously used heat pipes. Similar can be stated in using the heat exchanger 133 in the lower tubular framework. Here, the evaporator surface may be within a lower tubular framework. This concept substantially alters the current design of heat pipes.

In one embodiment, the current disclosed hyperpolarizer magnet system utilizes a magnet with tubular frameworks comprising end plates equipped with coil pockets to accommodate the coils whereas the coil former (i.e. support/backing ring where layers are wound is grooved to wind the coils/wire and embed the plurality of cooling tubes) can be made of aluminum, reinforced plastics, or any other convenient material to embed vertical cooling tubes/heat pipes herein. The vertically embedded cooling tubes are located either on the external coil surface or in the space between two adjacent coil formers. As mentioned, the magnet does not require a helium reservoir to contain liquid helium. The tubular framework, referred to in one aspect as end plates, of the coil are structurally fitted (i.e. bolted) to an annular shaped cold plate made of thermally conducting material. The cold plate is then suspended on its outer diameter within the vacuum vessel. Due to the absence of a helium reservoir, the thin-walled helium neck tube connecting to the vent stack is eliminated as well.

In one embodiment, the suspension rods between the cooling tubes are cooled by the cooling tubes themselves and at the same time suspend the magnet between the coldplate to the vacuum chamber top plate. One aspect implements a cold plate nearer a centralized region of the cryo-vessel. Another aspect integrates the cold plate in the lower tubular framework of the thermosiphons. Various embodiments may provide supports and suspension rods along any surface of the cryo-vessel or as elements of the plurality or cooling tubes (e.g. thermosiphon network) to suspend the magnet.

Furthermore, in one embodiment, an additional 4 K thermal shield (not shown), or extension of thermal shield 138 may be utilized such that it is situated between the outer magnet surface and an inner thermal shield 189 to ensure the cryocooler can be extracted timely and replaced without causing a magnet quench. If there is no liquefaction, the magnet would get increasingly warmer. In this novel configuration, most heat loads to the magnet are caused by thermal radiation, and thus the 4 K thermal shield greatly expands the ride-through time for the cryocooler 144 swap. In addition, embodiments of the thermal shield may comprise a hollow cavity or tubing to house a material with high heat capacity at 4 K (e.g. GOS ($Gd_2O_2S$)).

In contrast to an NMR system or MRI system where possible re-shimming may be conducted after quench or re-ramp to achieve magnet homogeneity, as desired, the hyperpolarizer can operate with designed field region homogeneity and field strength. Therefore, in one embodiment of the invention, ride-through for cryocooler exchange is not conducted since the magnet can be ramped down and ramped up again quickly without the need for field and homogeneity optimization.

Further, the vent stack has been removed from the prior system. Two valves sitting in helium gas atmosphere within the vent stack are removed. The helium gas from the externally located gas bottle that was used to maintain helium atmosphere within the vent stack is removed. The prior design utilized expensive specialized helium gas to ensure ice formation within the helium magnet was minimized. Issues as to the bottle running empty or becoming contaminated by the introduction of air or blocking of relief valves is further eliminated. From a safety standpoint, the current invention resolves and minimizes issues related to helium use and cost. If no cold helium leaves the cryo-vessel 102, neither quench duct nor oxygen monitor is needed in the patient room. Where 1 L of liquid helium produces 700 L of gas, an inventory of 40 L could potentially generate 28000 L of gas, (e.g. In case of magnet going normal (quench), that gas was previously routed through the vent stack in the hospital). This volume is no longer incorporated in the current system design. The cost savings is enormous with the modified design, from the quantity of helium utilized to the reduction in materials to manufacture the device (i.e. no piping for gas routing is utilized or needed in the above disclosed design), as well as the reduced constraints of pressure vessel directives.

As utilized for hyperpolarization, the cooling system of the invention has been designed, built, and tested to provide a low volume cryogen cooling system to cool a superconducting magnet. The hyperpolarization has stimulated many experiments in NMR superconducting magnet. In particular, the system has stimulated experimentation in NMR spectroscopy and imaging. The particular use of hyperpolarized substrates has gained tremendous attention in in vivo MR imaging, and is based on the dissolution-dynamic nuclear polarization (DNP) method. Specific details have been set forth herein such as specific quantities, sizes, etc. so as to provide a thorough understanding of embodiments. However, the embodiments presented herein may be practiced without such specific details also. In many cases, details concerning such considerations and the like have been omitted inasmuch as such details are not necessary to obtain a complete understanding of various embodiments and are within the skills of persons of ordinary skill in the relevant art.

In one embodiment, the cryocooler operates to maintain cryogenic temperature stability for the magnet, in order to maintain the superconductivity of the magnet, or referenced magnet coils. The operating temperature of a superconducting magnet is the cryogenic temperature at which the superconducting magnet reaches its superconducting state. In one embodiment, the system operates with liquid helium as a cryogen, at a sub-atmospheric pressure. The medium temperature superconducting magnet may perform at atmospheric as well as slight sub-atmospheric pressure; however, the low temperature superconducting magnet may preferably perform at sub-atmospheric pressure. Examples of the superconducting magnet may comprise, but not limited to, magnesium diboride ($MgB_2$), using helium, hydrogen, or neon as coolant. In a further embodiment, the low temperature magnet may comprise, but not limited to, niobium-tin ($Nb_3Sn$), niobium-gallium ($Nb_3Ga$), and vanadium-gallium ($V_3Ga$) type superconducting wires.

While the invention has been described in considerable detail with reference to a few exemplary embodiments only, it will be appreciated that it is not intended to limit the invention to these embodiments only, since various modifications, omissions, additions and substitutions may be made to the disclosed embodiments without materially departing from the scope of the invention. In addition, many modifications may be made to adapt to a particular situation or an installation, without departing from the essential scope of the invention. Thus, it must be understood that the above invention has been described by way of illustration and not limitation. Accordingly, it is intended to cover all modifications, omissions, additions, substitutions or the like, which may be comprised within the scope and the spirit of the invention as defined by the claims.

The invention claimed is:

1. A low volume cryogen cooling system comprising:
a cryo-vessel having sidewalls, a top plate, and a bottom plate to form a hermetically sealed vacuum chamber;
an internally stored gas supply configured to satisfy a plurality of operating regimes including quench, and comprising one or more pressurized gas bottles positioned internal to the cryo-vessel, the gas bottle storing pressurized gaseous cryogen;
a valve configured to charge the one or more gas bottles with a desired amount of gas at a specified pressure either prior to or after assembly of the cryo-vessel;
at least one superconducting magnet capable of generating a magnetic field and operating at temperatures less than 4 Kelvin, wherein the superconducting magnet is suspended in the hermetically sealed vacuum chamber by way of a suspension rod, and further comprising a charging connection;
a plurality of cooling tubes arranged vertically around the superconducting magnet, each cooling tube have a top portion interconnected with an uppermost tubular framework and a bottom portion terminating at a lower tubular framework, wherein the top portion and the bottom portion are adjoined by a tube link;
a recondenser connected to a second stage of the cryocooler which provides a thermal connection, the recondenser comprising tubing that receives gaseous cryogen from the plurality of cooling tubes, liquefies the gaseous cryogen into liquid cryogen and directs the liquid cryogen to the lower tubular framework by way of gravitational force;
a first heat exchanger embedded in the uppermost tubular framework;
a thermal shield encompassing the plurality of cooling tubes and in thermal contact with a first stage of a cryocooler, the thermal shield having an inner component and an outer component that connect at a top surface and a bottom surface to enclose the plurality of cooling tubes and form a vacuum space centralized at a core of the cryo-vessel; and
a pathway accessing the core;
wherein the plurality of cooling tubes is filled with liquefied cryogen to form a circulating thermosiphon system adapted to cool the superconducting magnet to temperatures at or below about 4 Kelvin, and further wherein the plurality of cooling tubes is configured to evaporate and condense the liquefied cryogen received from the recondenser.

2. The system of claim 1, wherein the plurality of cooling tubes are arranged cylindrically in vertical orientation to house the superconducting magnet.

3. The system of claim 2, wherein the plurality of cooling tubes are embedded in the superconducting magnet.

4. The system of claim 1, wherein the top portion of the plurality of cooling tubes comprise condensing cups with liquefaction fins and the bottom portion further comprises an evaporator surface.

5. The system of claim 1, wherein the lower tubular framework comprises a second heat exchanger.

6. The system of claim 1, wherein at least one of the one or more pressurized gas bottles are positioned external to the outer component of the thermal shield.

7. The system of claim 1, wherein the recondenser is integrated in the uppermost tubular framework.

8. The system of claim 1, wherein the system is implemented in spectroscopy including nuclear magnetic resonance (NMR), paramagnetic NMR, electron paramagnetic resonance (EPR), magnetic resonance imaging (MRI), and Raman spectroscopy.

* * * * *